(12) United States Patent
Lee et al.

(10) Patent No.: US 10,986,754 B2
(45) Date of Patent: Apr. 20, 2021

(54) CIRCUIT BOARD MODULE AND HEAT-DISSIPATING BOARD STRUCTURE THEREOF

(71) Applicant: CAREER TECHNOLOGY MFG. CO., LTD., New Taipei (TW)

(72) Inventors: Mou-Lin Lee, Yilan County (TW); Chia-Hung Kuo, New Taipei (TW)

(73) Assignee: CAREER TECHNOLOGY MFG. CO., LTD., New Taipei (TW)

( * ) Notice: Subject to any disclaimer, the term of this patent is extended or adjusted under 35 U.S.C. 154(b) by 0 days.

(21) Appl. No.: 16/429,804

(22) Filed: Jun. 3, 2019

(65) Prior Publication Data
US 2020/0275583 A1  Aug. 27, 2020

(30) Foreign Application Priority Data
Feb. 26, 2019 (TW) ................................. 108106396

(51) Int. Cl.
*G06F 1/16* (2006.01)
*H05K 5/00* (2006.01)
(Continued)

(52) U.S. Cl.
CPC ......... *H05K 7/20254* (2013.01); *H05K 7/205* (2013.01); *H05K 7/20263* (2013.01); *H05K 7/20436* (2013.01)

(58) Field of Classification Search
CPC ........... H05K 7/20254; H05K 7/20263; H05K 7/20436; H05K 7/20463; H05K 7/205
(Continued)

(56) References Cited

U.S. PATENT DOCUMENTS 6,082,443 A * 7/2000 Yamamoto .......... F28D 15/0233
165/104.21
6,269,866 B1 * 8/2001 Yamamoto .......... F28D 15/0233
165/104.26
(Continued)

FOREIGN PATENT DOCUMENTS

CN 101288350 A 10/2008
CN 101653053 A 2/2010
(Continued)

*Primary Examiner* — Anthony M Haughton
(74) *Attorney, Agent, or Firm* — Li & Cai Intellectual Property (USA) Office

(57) ABSTRACT

A heat-dissipating board structure and a circuit board module are provided. The heat-dissipating board structure includes a first board, a second board, a heat-transmitting layer and a buffering liquid. The first board has a first inner surface and the first inner surface has a plurality of first metal protrusions thereon. The second board is correspondingly engaged with the first board to form an accommodating chamber therebetween. The second board has a second inner surface and the second inner surface has a plurality of second metal protrusions thereon. The heat-transmitting layer is disposed in the accommodating chamber and arranged between the first metal protrusions and the second metal protrusions. The buffering liquid is filled in a residual space of the accommodating chamber. Therefore, the heat-dissipating board structure can meet the design requirements of a light-weight and thin electronic product and can effectively remove heat from a heat source.

16 Claims, 11 Drawing Sheets

(51) Int. Cl.
  *H05K 7/00* (2006.01)
  *H05K 7/20* (2006.01)

(58) Field of Classification Search
  USPC .................................. 361/699, 701, 702
  See application file for complete search history.

(56) References Cited

U.S. PATENT DOCUMENTS

| | | | | |
|---|---|---|---|---|
| 6,977,813 | B2* | 12/2005 | Fuseya | G06F 1/20 |
| | | | | 165/104.33 |
| 10,619,948 | B2* | 4/2020 | Ideguchi | F28F 21/08 |
| 2003/0159806 | A1* | 8/2003 | Sehmbey | F28F 3/027 |
| | | | | 165/80.3 |
| 2007/0095471 | A1 | 5/2007 | Ito et al. | |
| 2007/0227697 | A1* | 10/2007 | Takahashi | H01L 23/473 |
| | | | | 165/80.4 |
| 2008/0047141 | A1* | 2/2008 | Yang | B21D 53/02 |
| | | | | 29/890.03 |
| 2010/0090336 | A1* | 4/2010 | Yoshida | H01L 23/473 |
| | | | | 257/717 |
| 2011/0272120 | A1* | 11/2011 | Joshi | F28D 1/05366 |
| | | | | 165/104.13 |
| 2012/0014066 | A1* | 1/2012 | Morino | H01L 23/473 |
| | | | | 361/707 |
| 2013/0112388 | A1* | 5/2013 | Kwak | H01L 23/473 |
| | | | | 165/185 |
| 2015/0369545 | A1* | 12/2015 | Naritomi | F28F 3/12 |
| | | | | 165/76 |
| 2016/0290728 | A1* | 10/2016 | Coteus | H01L 23/473 |

FOREIGN PATENT DOCUMENTS

| | | |
|---|---|---|
| CN | 107789112 A | 3/2018 |
| JP | 2009239043 A | 10/2009 |
| JP | 2014192408 A | 10/2014 |
| JP | 2014228270 A | 12/2014 |
| KR | 101692490 B1 | 1/2017 |
| KR | 101826341 B1 | 2/2018 |
| TW | M393953 U1 | 12/2010 |

\* cited by examiner

CIRCUIT BOARD MODULE AND HEAT-DISSIPATING BOARD STRUCTURE THEREOF

CROSS-REFERENCE TO RELATED PATENT APPLICATION

This application claims the benefit of priority to Taiwan Patent Application No. 108106396, filed on Feb. 26, 2019. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a heat-dissipating structure, and more particularly to a heat-dissipating board structure and a circuit board module using the same.

BACKGROUND OF THE DISCLOSURE

In response to the advent of the 5G generation, high-frequency high-speed products (e.g., antenna) are constantly required to have better performance. In addition, the signal transmission speed needs to be increased and the decrease in signal integrity due to the signal loss during the transmission process should be avoided. With the constant development of electronic products toward the trend of light weight, thin profile and high performance, how effective heat dissipation can be provided in a limited internal space, i.e., using a heat-dissipating structure to remove heat generated from the electronic component in operation, has become one of the problems to be solved in the related art. For example, the heat dissipation path not only focuses on the XY direction of the Cartesian coordinate system, but the contribution of heat conduction in the Z direction to the overall heat dissipation efficiency should also be considered.

For the heat dissipation process, the heat-dissipating structure can directly contact the electronic component or be spaced apart from the electronic component. For example, a graphite, metal or graphite/metal cooling sheet can be directly adhered to a high-power electronic component (e.g., processor) or to an adjacent part (e.g., back cover), so as to remove heat from the electronic component. In addition, a high-power electronic component such as an LED can be disposed on a heat pipe. Accordingly, the heat generated from the electronic component can be transmitted to a heat-dissipating structure such as a heat sink and then be outwardly dissipated from the heat-dissipating structure.

Although said cooling sheet can cool the operated electronic component in time, its heat-dissipating ability still has some room for improvement and it is unfavorable to light-weight designs. In addition, the heat pipe has a higher cost and, for heat dissipation, needs to work with an additional heat-dissipating structure.

SUMMARY OF THE DISCLOSURE

In response to the above-referenced technical inadequacies, the present disclosure provides a heat-dissipating board structure, which has excellent heat transmission effects in the X, Y and Z directions of the Cartesian coordinate system, and a circuit board module using the same.

In one aspect, the present disclosure provides a circuit board module which includes a heat-dissipating board structure, a high-frequency high-speed board and a heat-conducting member. The heat-dissipating board structure includes a first board, a second board, a heat-transmitting layer and a buffering liquid. The first board has a first inner surface and the first inner surface has a plurality of first metal protrusions thereon. The second board is correspondingly engaged with the first board to form an accommodating chamber therebetween. The second board has a second inner surface and the second inner surface has a plurality of second metal protrusions thereon. The heat-transmitting layer is disposed in the accommodating chamber and arranged between the first metal protrusions and the second metal protrusions. The buffering liquid is filled in a residual space of the accommodating chamber. The high-frequency high-speed board is disposed on the first board of the heat-dissipating board structure. The high-frequency high-speed board includes a dielectric board and at least one functional circuit layer formed on the dielectric board. The heat-conducting member has a first end portion and a second end portion. The first end portion is thermally connected to the first board of the heat-dissipating board structure and the second end portion is disposed in proximity to the functional circuit layer.

In one aspect, the present disclosure provides a heat-dissipating board structure which includes a first board, a second board, a heat-transmitting layer and a buffering liquid. The first board has a first inner surface and the first inner surface has a plurality of first metal protrusions thereon. The second board is correspondingly engaged with the first board to form an accommodating chamber therebetween. The second board has a second inner surface and the second inner surface has a plurality of second metal protrusions thereon. The heat-transmitting layer is disposed in the accommodating chamber and arranged between the first metal protrusions and the second metal protrusions. The buffering liquid is filled in a residual space of the accommodating chamber.

In certain embodiments, the first metal protrusions and the second metal protrusions are staggered relative to each other.

In certain embodiments, the heat-transmitting layer presents in the form of a porous layer or a continuous layer.

In certain embodiments, the first board includes a first substrate layer and at least one first metal layer formed on the first substrate layer, and the first metal protrusions are formed on the first metal layer.

In certain embodiments, the first board has at least one first blind hole that passes through the first substrate layer, and the first blind hole is filled with a heat-conducting material.

In certain embodiments, the first board has at least one first through hole that passes through the first substrate layer and the first metal layer, and the first through hole is filled with a heat-conducting material.

In certain embodiments, the second board includes a second substrate layer and at least one second metal layer formed on the second substrate layer, and the second metal protrusions are formed on the second metal layer.

In certain embodiments, the second board has at least one second blind hole that passes through the second substrate layer, and the second blind hole is filled with a heat-conducting material.

In certain embodiments, the second board has at least one second through hole that passes through the second substrate layer and the first metal layer, and the second through hole is filled with a heat-conducting material.

In certain embodiments, the first board has a first inner side portion and at least one first outer side portion arranged at one side of the first inner side portion, the second board has a second inner side portion and at least one second outer side portion arranged at one side of the second inner side portion, and the accommodating chamber is formed between the first inner side portion and the second inner side portion.

In certain embodiments, the circuit board module further includes at least one heat-conducting column connected between the first outer side portion and the second outer side portion.

In certain embodiments, the circuit board module has a thickness between 0.2 mm and 0.5 mm. The first metal protrusions and the second metal protrusions have an average height between 30 μm and 220 μm.

One of the advantages of the present disclosure is that the heat-dissipating board structure can balance a thin and light-weight design with structural strength and heat-dissipation efficiency so as to meet the design requirements of a light-weight and thin electronic product by the technical solution as follows: the first board is correspondingly engaged with the second board to form an accommodating chamber therebetween, the heat-transmitting layer is disposed in the accommodating chamber and arranged between the first metal protrusions on the inner surface of the first board and the second metal protrusions on the inner surface of the second board, and the buffering liquid is filled in a residual space of the accommodating chamber.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

DETAILED DESCRIPTION OF THE EXEMPLARY EMBODIMENTS

Figure 1:
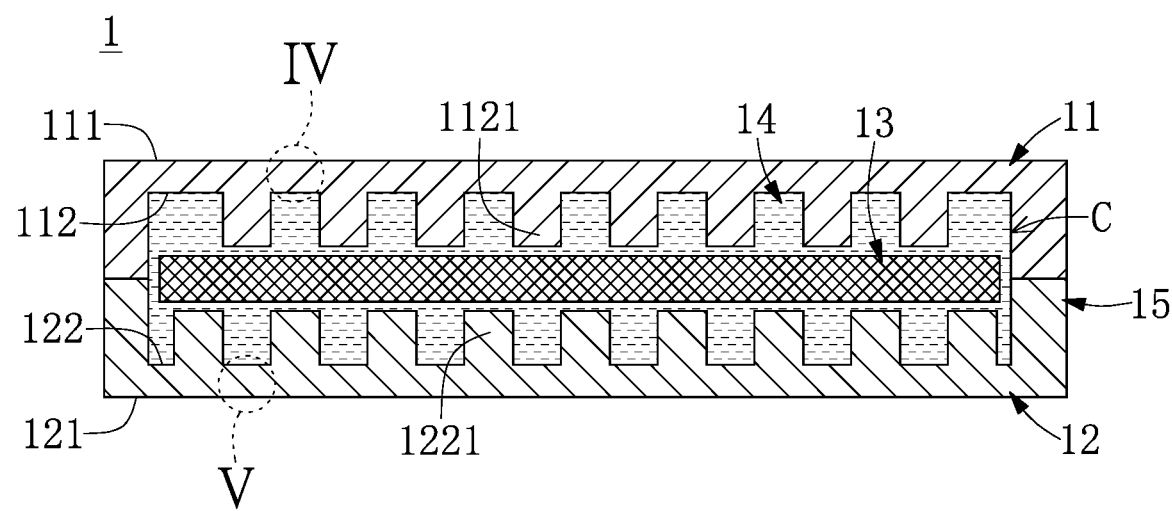
FIG. 1 is a schematic view of a heat-dissipating board structure according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

First Embodiment

Figure 2:
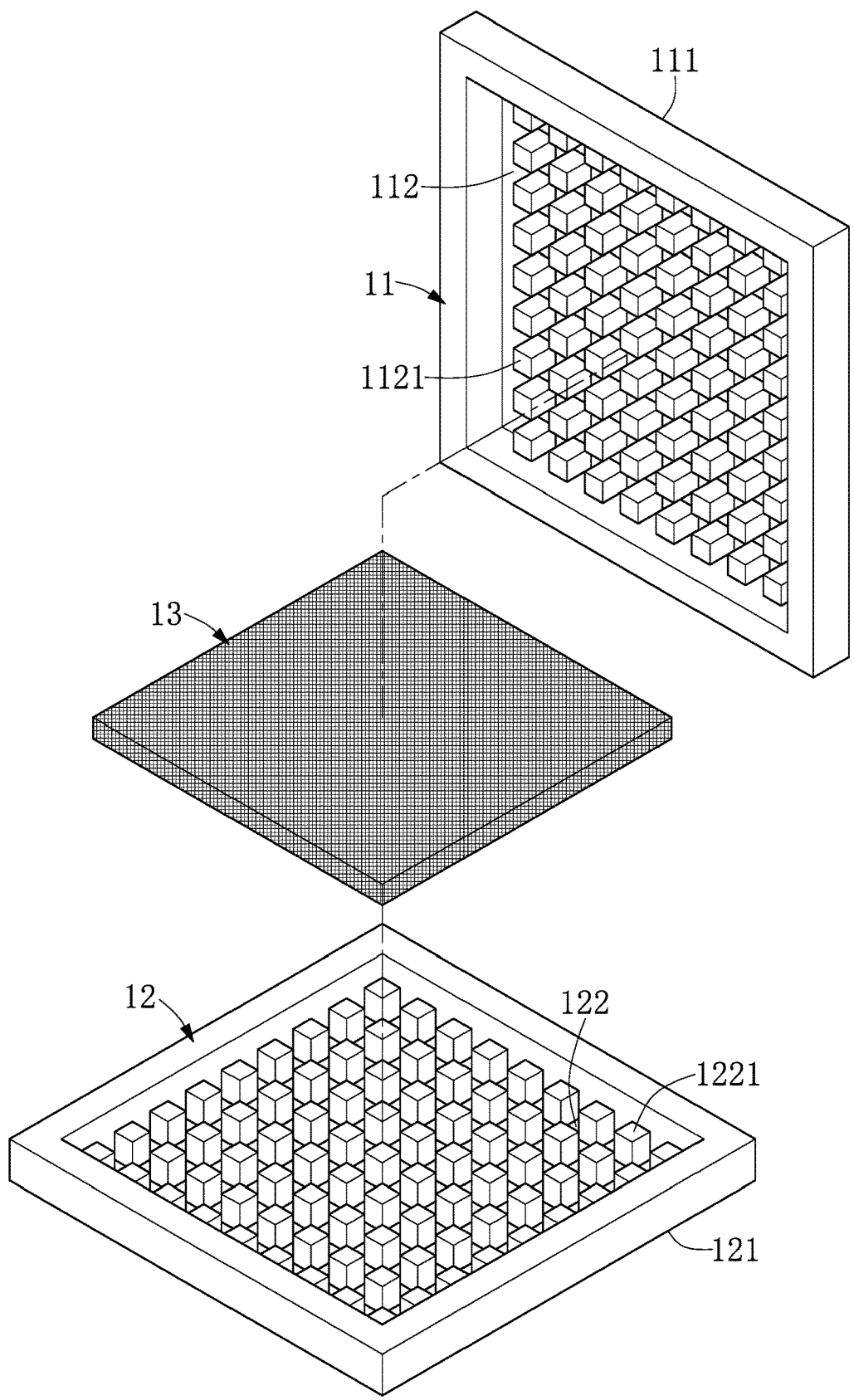
FIG. 2 is a perspective view of the heat-dissipating board structure according to the first embodiment of the present disclosure.
Figure 3:
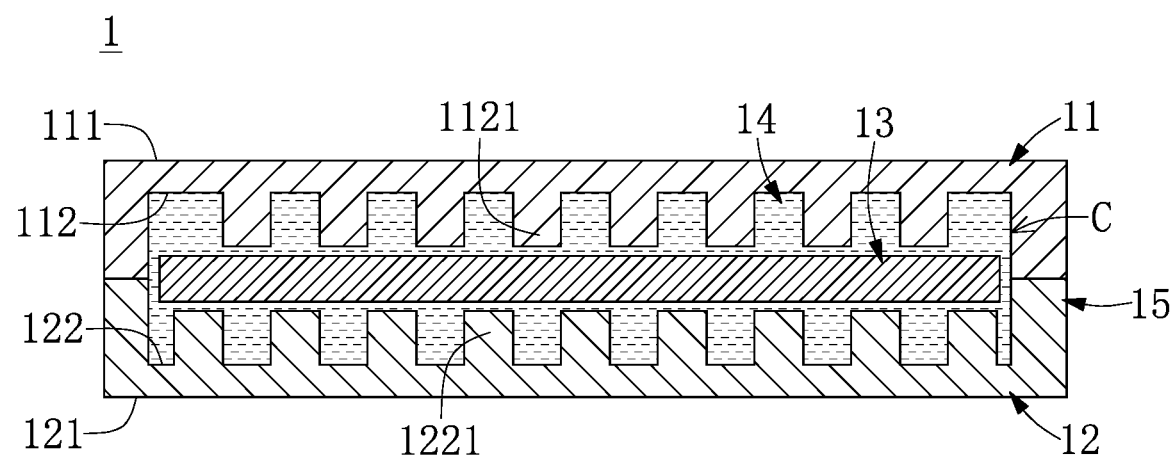
FIG. 3 is another schematic view of the heat-dissipating board structure according to the first embodiment of the present disclosure.

Referring to FIG. 1 to FIG. 3, a first embodiment of the present disclosure provides a heat-dissipating board structure 1 which includes a first board 11, a second board 12, a heat-transmitting layer 13 and a buffering liquid 14. Each of the first board 11 and the second board 12 has a three-dimensional heat-conducting pattern on its surface. The first board 11 and the second board 12 are correspondingly engaged with and complement each other to form a sealed accommodating chamber C. The heat-transmitting layer 13 is disposed in the accommodating chamber C and the buffering liquid 14 is filled in a residual space of the accommodating chamber C. The buffering liquid 14 can be pure water, but is not limited thereto.

In use, the first board 11 can conduct heat outwardly from a heat source and quickly transmit the heat to the accommodating chamber C. The outwardly conducted heat, by the cooperation of the three-dimensional heat-conducting patterns of the first board 11 and the second board 12, the buffering liquid 14 and the heat-transmitting layer 13, can be transmitted in the XY direction and subsequently transmitted to the second board 12 over a large area and along the Z direction. After that, the heat can be dissipated to the exterior environment from the second board 12.

More specifically, the first board 11 can serve as a heat absorption side. The first board 11 has a first outer surface 111 and a first inner surface 112 opposite to the first outer surface 111, wherein the first inner surface 112 has a plurality of first metal protrusions 1121 thereon. The second board 12 can serve as a heat dissipation side. The second board 12 has a second outer surface 121 and a second inner surface 122 opposite to the second outer surface 121, wherein the second inner surface 122 has a plurality of second metal protrusions 1221 thereon. More specifically, the first metal protrusions 1121 can be arranged in an array on the first inner surface 112. The distribution area of the first metal protrusions 1121 relative to the first inner surface 112 can be from 5% to 30%. The second metal protrusions 1221 can be arranged in an array on the second inner surface 122. The distribution area of the second metal protrusions 1221 relative to the second inner surface 122 can be from 5% to 30%. However, such details are merely examples and are not meant to limit the present disclosure. According to particular requirements, the first metal protrusions 1121 and the second metal protrusions 1221 can use other regular arrangement manners.

In the present embodiment, each of the first board 11 and the second board 12 can be a flexible board such as a flexible PCB. The first metal protrusions 1121 and the second metal protrusions 1221 can be formed by electroplating or screen printing. The respective average height of the first metal protrusions 1121 and the second metal protrusions 1221 can be from 30 mm to 220 mm. The material of the first metal protrusions 1121 and the second metal protrusions 1221 can be copper or other high thermal conductivity metals. The material of the first metal protrusions 1121 can be the same as or different from that of the second metal protrusions 1221. Each of first metal protrusions 1121 and each of the second metal protrusions 1221 can be in the form of a square column or a circular column. The shape of the first metal protrusions 1121 can be the same as or different from that of the second metal protrusions 1221. However, these details are not meant to limit the present disclosure.

Figure 4:
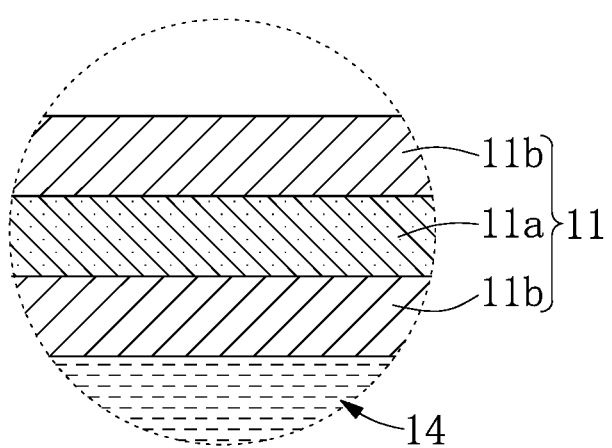
FIG. 4 is an enlarged view of part IV of FIG. 1.
Figure 5:
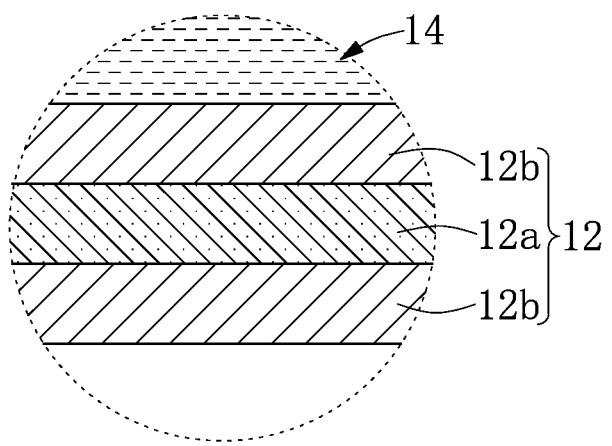
FIG. 5 is an enlarged view of part V of FIG. 1.

Reference is made to FIG. 1 along with FIG. 4 and FIG. 5. FIG. 4 and FIG. 5 both show an implementation manner of the first board 11 and the second board 12. The first board 11 can be formed from a single metal such as copper or another high thermal conductivity metal. According to particular requirements, the first board 11 can be composed of a metal and a polymer, or of a polymer composite material. More specifically, the first board 11 can include a first substrate layer 11a and a first metal layer 11b formed on the first substrate layer 11a. The first metal protrusions 1121 are formed on the first metal layer 11b. The second board 12 can include a second substrate layer 12a and a second metal layer 12b formed on the second substrate layer 12a. The second metal protrusions 1221 are formed on the second metal layer 12b. It should be noted that, the first substrate layer 11a and the second substrate layer 12a can provide a supporting function, and the first metal layer 11b and the second metal layer 12b can provide heat absorption and dissipation functions.

Figure 6:
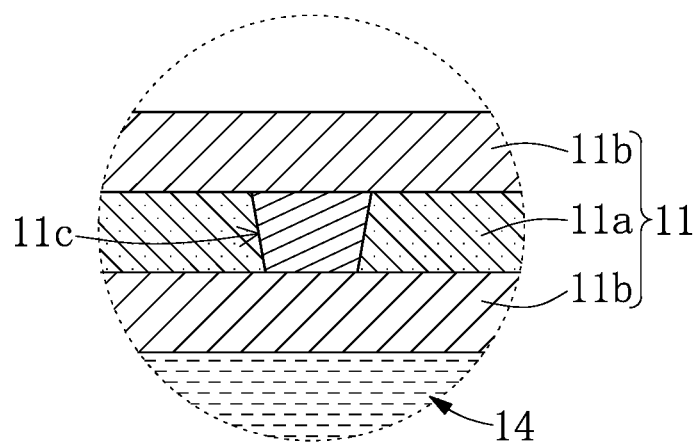
FIG. 6 is another enlarged view of part IV of FIG. 1.
Figure 7:
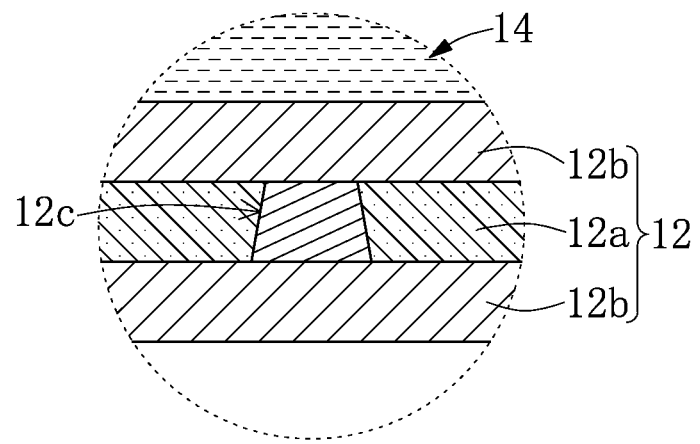
FIG. 7 is another enlarged view of part V of FIG. 1.

Reference is now made to FIG. 6 and FIG. 7, which shows another implementation manner of the first board 11 and the second board 12. When the first board 11 includes a first substrate layer 11a and two first metal layers 11b respectively formed on two opposite surfaces of the first substrate layer 11a, as shown in FIG. 6, one or more first blind holes 11c can be formed on the first board 11. The first blind holes 11c pass through the first substrate layer 11a and are filled with a heat-conducting material to form a thermally conductive connection between the two first metal layers 11b. When the second board 12 includes a second substrate layer 12a and two second metal layers 12b respectively formed on two opposite surfaces of the second substrate layer 12a, as shown in FIG. 7, one or more second blind holes 12c can be formed on the second board 12. The second blind holes 12c pass through the second substrate layer 12a and are filled with a heat-conducting material to form a thermally conductive connection between the two second metal layers 12b. Therefore, the overall heat dissipation efficiency can be increased.

Figure 8:
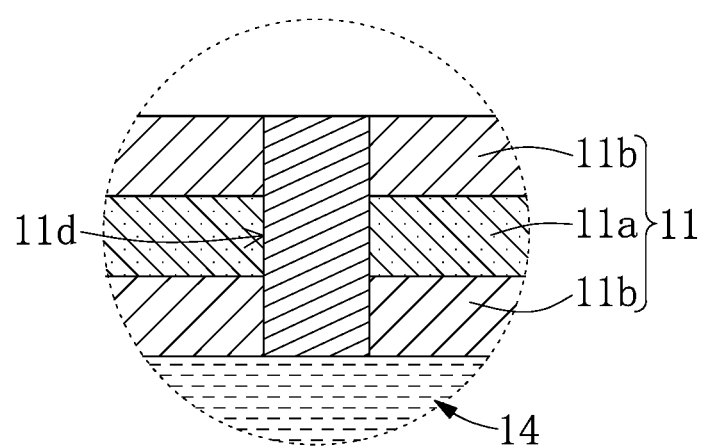
FIG. 8 is still another enlarged view of part IV of FIG. 1.
Figure 9:
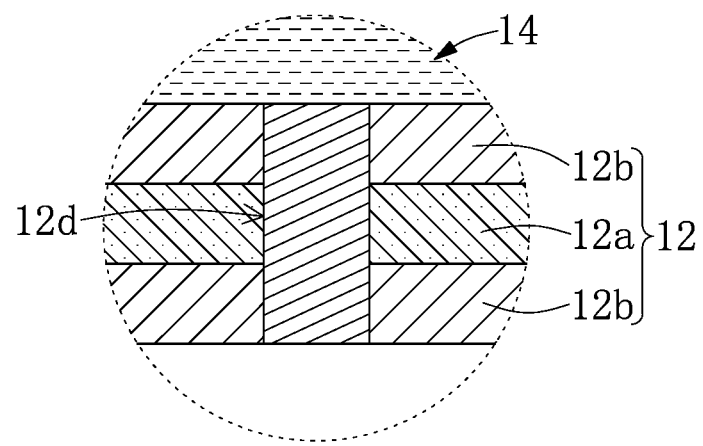
FIG. 9 is still another enlarged view of part V of FIG. 1.

Reference is now made to FIG. 8 and FIG. 9, which shows still another implementation manner of the first board 11 and the second board 12. In order to form the thermally conductive connection between the two first metal layers 11b, one or more first through holes 11d can be formed on the first board 11, wherein the first through holes 11d pass through the first substrate layer 11a and the first metal layer 11b and are filled with a heat-conducting material, as shown in FIG. 8. In order to form the thermally conductive connection between the two second metal layers 12b, one or more second through holes 12d can be formed on the second board 12, wherein the second through holes 12d pass through the second substrate layer 12a and the second metal layer 12b and are filled with a heat-conducting material, as shown in FIG. 9.

In the present embodiment, the material of the first substrate layer 11a and the second substrate layer 12a can be an unmodified or modified polyimine, an unmodified or modified liquid crystal polymer, or a glass fiber reinforced epoxy resin. Said modified polyimine or modified liquid crystal polymer can have function monomer(s) (e.g., aromatic monomer) in its molecular chain structure. The material of first substrate layer 11a can be the same as or different from that of the second substrate layer 12a. The material of the first metal layer 11b and the second metal layer 12b can be copper or other high thermal conductivity metals. The material of first metal layer 11b can be the same as or different from that of the second metal layer 12b. The material filled in the first and second blind holes 11c, 12c or the first and second through holes 11d, 12d can be a metal or metal based material, a carbon or carbon based material, or combinations thereof. However, these details are not meant to limit the present disclosure.

In the present embodiment, the first board 11 and the second board 12 can have a regular shape such as square or rectangular. The first board 11 and the second board 12 can be combined together by diffusion bonding, but is not limited thereto. In order to form the accommodating chamber C, the first inner surface 112 of the first board 11 and the second inner surface 122 of the second board 12 can have an annular blocking wall 15 therebetween, and the annular blocking wall 15 surrounds the first metal protrusions 1121 and the second metal protrusions 1221. More specifically, an upper portion of the annular blocking wall 15 can be integrally formed with the first board 11 and a lower portion of the annular blocking wall 15 can be integrally formed with the second board 12, but are not limited thereto. In other embodiments, the entire annular blocking wall 15 can be integrally formed with the first board 11 and the second board 12. The thickness of the annular blocking wall 15 can be from 3 mm to 6 mm to facilitate the engagement of the first board 11 and the second board 12.

In the present embodiment, the heat-transmitting layer 13 can be presented in the form of a porous layer or continuous layer. The material of the heat-transmitting layer 13 can be a high thermal conductivity metal such as copper, graphite or carbon fiber. For example, the heat-transmitting layer 13 can be a metal net, metal sheet, graphite sheet, graphite paper or carbon fiber net. Under the circumstance that the heat-transmitting layer 13 is a porous layer, the heat-transmitting layer 13 has a plurality of holes (not numbered) that can be arranged in an array. Each of the holes can have circular, square or other polygonal shapes, and has a diameter from 25 mm to 200 mm. However, such details are merely examples and are not meant to limit the present disclosure. It should be noted that, under the circumstance that the heat-transmitting layer 13 is a porous layer and the first metal protrusions 1121 and the second metal protrusions 1221 are staggered relative to each other, a number of heat-transmitting channels can be provided in the accommodating chamber C and the buffering liquid 14 can increase the heat transmission effect in the XY direction. Preferably, the heat-transmitting layer 13, the first metal protrusions 1121 and the second metal protrusions 1221 are not in contact with each other.

Second Embodiment

Figure 10:
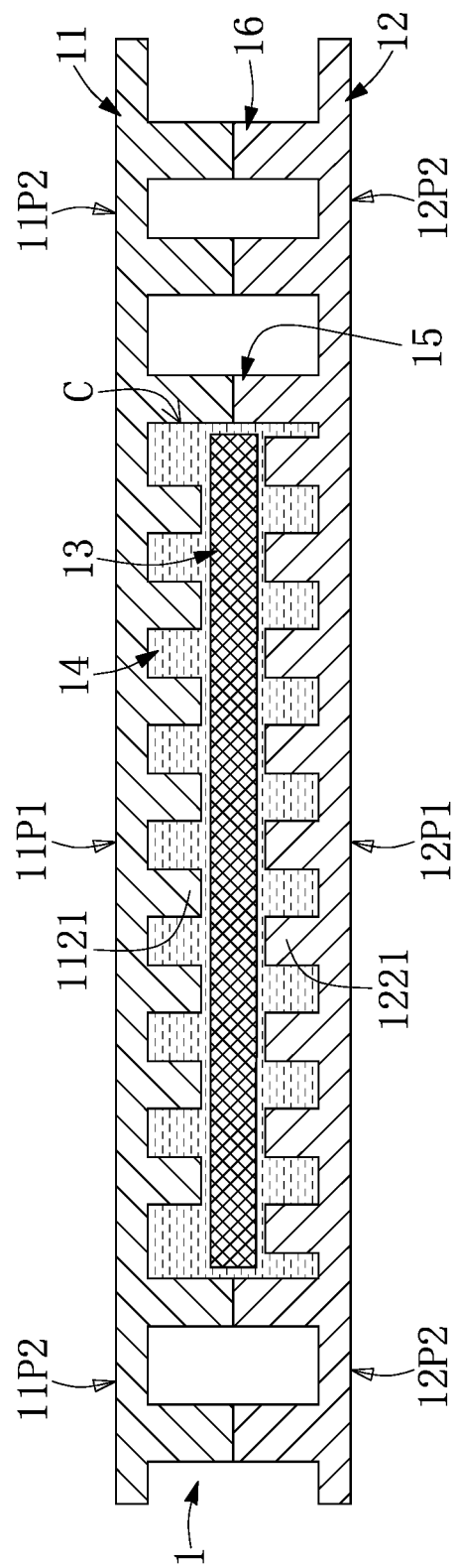
FIG. 10 is a schematic view of the heat-dissipating board structure according to the first embodiment of the present disclosure.
Figure 11:
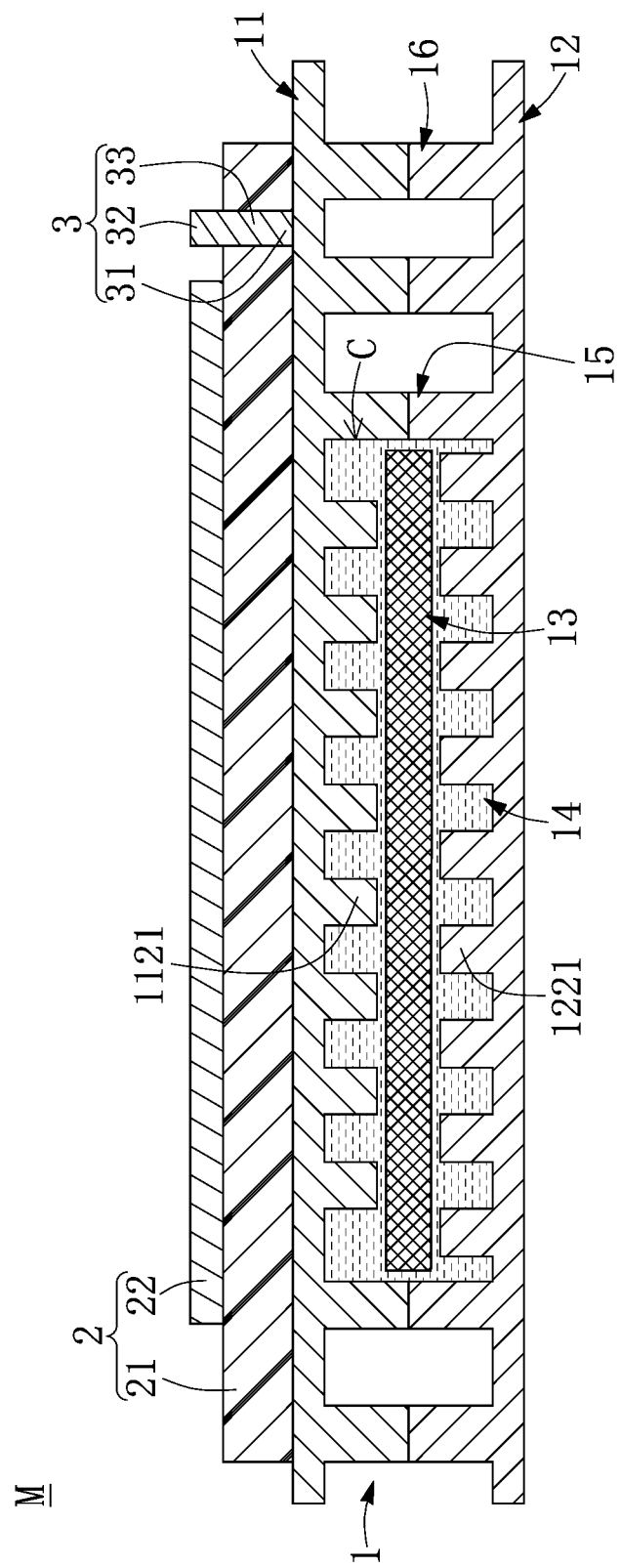
FIG. 11 is a schematic view of a circuit board module of the present disclosure.

Referring to FIG. 10, a second embodiment of the present disclosure provides a heat-dissipating board structure 1 which includes a first board 11, a second board 12, a heat-transmitting layer 13 and a buffering liquid 14. Each of the first board 11 and the second board 12 has a three-dimensional heat-conducting pattern on its surface. The first board 11 and the second board 12 are correspondingly engaged with and complement each other to form a sealed accommodating chamber C. The heat-transmitting layer 13 is disposed in the accommodating chamber C and the buffering liquid 14 is filled in a residual space of the accommodating chamber C. The buffering liquid 14 can be pure water, but is not limited thereto. The main difference of the present embodiment from the first embodiment is that heat-dissipating board structure 1 further includes at least one heat-conducting column 16.

In the present embodiment, the first board 11 has a first inner side portion 11P1 and at least one first outer side portion 11P2 arranged at one side of the first inner side portion 11P1, and the second board 12 has a second inner side portion 12P1 and at least one second outer side portion 12P2 arranged at one side of the second inner side portion 12P1. The accommodating chamber C with the heat-transmitting layer 13 and the buffering liquid 14 therein is disposed between the first inner side portion 11P1 and the second inner side portion 12P1. Two ends of the heat-conducting column 16 are respectively connected to the first outer side portion 11P2 and the second outer side portion 11P2. Therefore, the structural stability and the flexibility of use of the heat-dissipating board structure 1 can be increased.

Referring to FIG. 11 to FIG. 14, the present disclosure further provides a circuit board module M which includes a heat-dissipating board structure 1 having the aforesaid structure, a high-frequency high-speed substrate 2 and a heat-conducting member 3. The high-frequency high-speed substrate 2 is disposed on the first board 11 of the heat-dissipating board structure 1. The heat-conducting member 3 is configured to guide heat generated from a heat source on the high-frequency high-speed substrate 2 to the first board 11 for effective heat dissipation.

In the present embodiment, the high-frequency high-speed substrate 2 includes a dielectric board 21 and at least one functional circuit layer 22 formed on the dielectric board 21. The functional circuit layer 22 can be an antenna structure, but is not limited thereto. The heat-conducting member 3 has a first end portion 31, a second end portion 32, and a main body portion 33 connected between the first end portion 31 and the second end portion 32. The first end portion 31 is thermally connected to the first board 11, and the second end portion 32 is disposed in proximity to the functional circuit layer 22.

More specifically, the dielectric board 21 of the high-frequency high-speed substrate 2 can be directly attached to the first board 11 of the heat-dissipating board structure 1. Preferably, the dielectric board 21 can be integrally formed on the first board 11 by a process for preparing a printed circuit board or flexible board. According to particular requirements, a suitable thermally conductive connecting interface such as a heat conductive adhesive can be used to connect the dielectric board 21 to the first board 11. However, such details are merely examples and are not meant to limit the present disclosure. Under such structure, the heat-conducting member 3 can be presented in the form of a column, wherein the first end portion 31 and the main body portion 33 of the heat-conducting member 3 are embedded in the dielectric board 21, and the first end portion 31 directly contacts the first board 11. It should be noted that the second end portion 32 of the heat-conducting member 3 protrudes out of the dielectric board 21 from a position in proximity of the functional circuit layer 22 to perform a heat exchange with the functional circuit layer 22 by heat convection.

Figure 12:
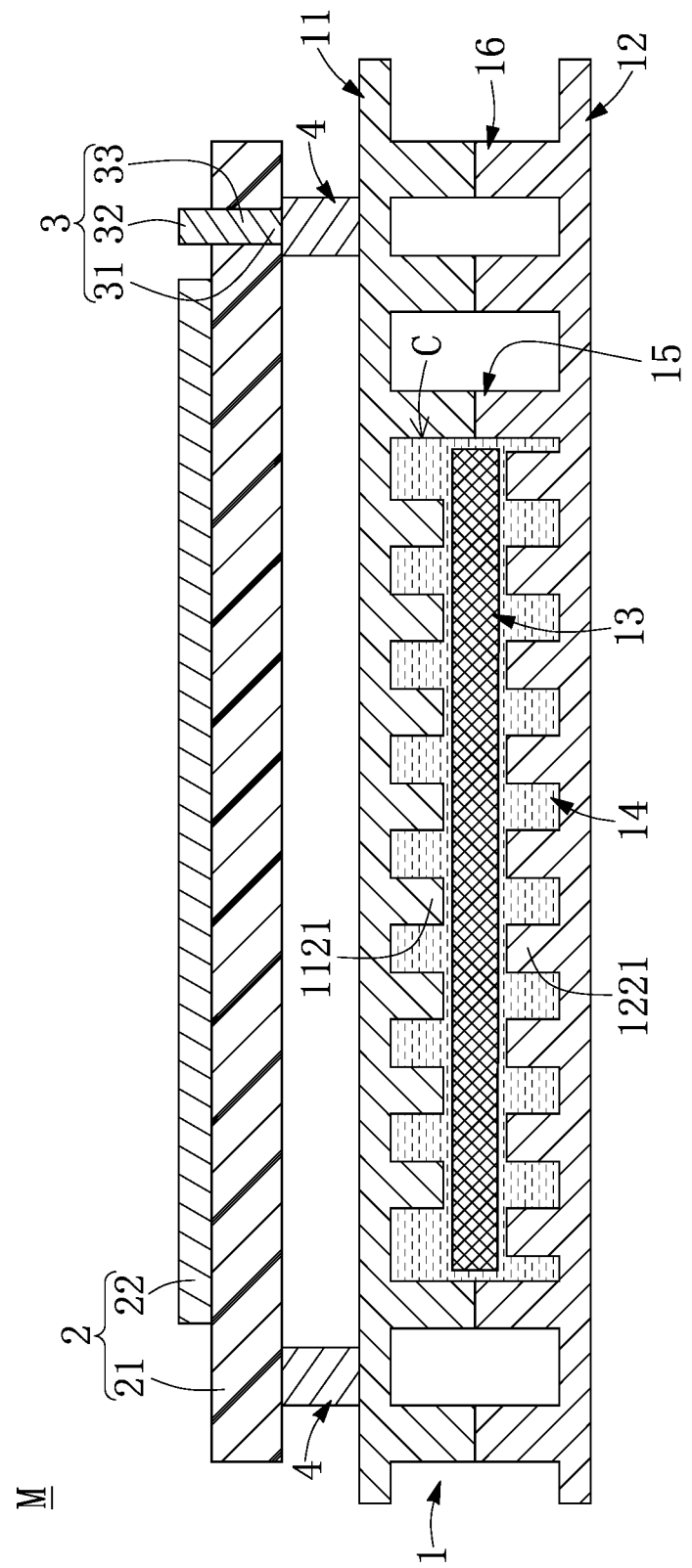
FIG. 12 is another schematic view of the circuit board module of the present disclosure.
Figure 13:
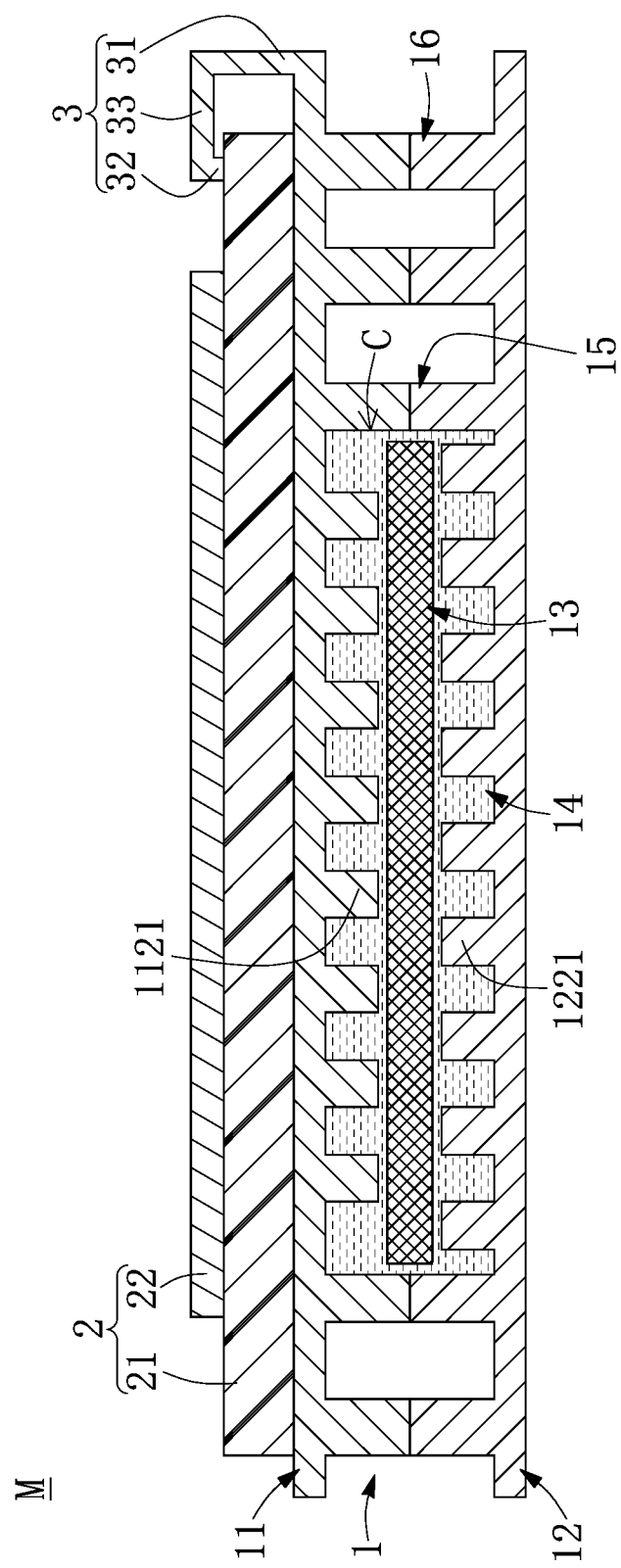
FIG. 13 is still another schematic view of the circuit board module of the present disclosure.
Figure 14:
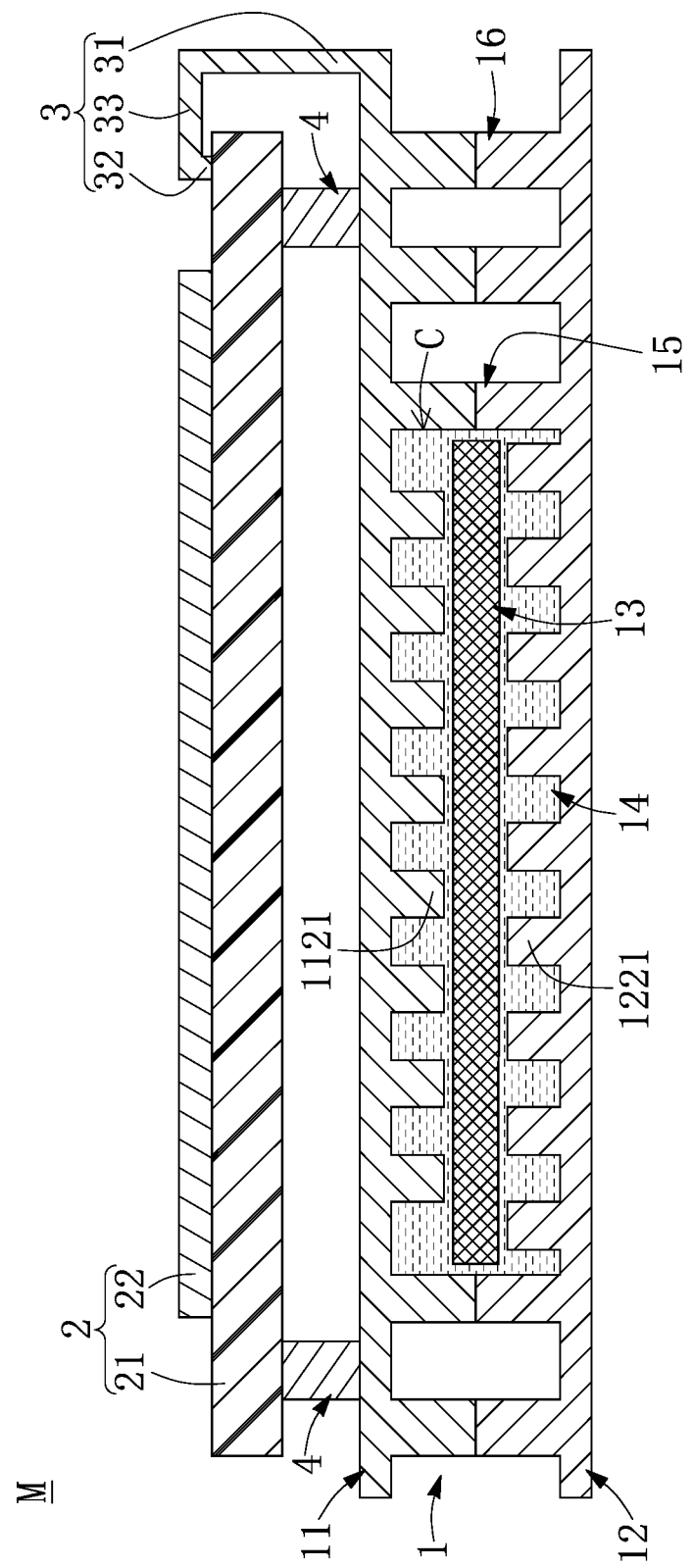
FIG. 14 is still another schematic view of the circuit board module of the present disclosure.

In addition, the dielectric board 21 of the high-frequency high-speed substrate 2 can be disposed above the first board 11 of the heat-dissipating board structure 1 via a plurality of supporting columns 4, as shown in FIG. 12. That is, the supporting columns 4 can be disposed between the dielectric board 21 and the first board 11. Under such structure, the heat-conducting member 3 can be presented in the form of a column, wherein the first end portion 31 and the main body portion 33 of the heat-conducting member 3 are embedded in the dielectric board 21, and the first end portion 31 directly contacts one of the supporting columns 4. Accordingly, the first end portion 31 is thermally connected to the first board 11 via the supporting column 4. The second end portion 32 of the heat-conducting member 3 protrudes out of the dielectric board 21 from a position in proximity of the functional circuit layer 22 to perform a heat exchange with the functional circuit layer 22 by heat convection. Accordingly, the second end portion 32 of the heat-conducting member 3 can be disposed in proximity of the functional circuit layer 22 to perform a heat exchange with the functional circuit layer 22 by heat convection.

In addition, under the aforesaid two structures, the heat-conducting member 3 can be presented in the form of a belt, wherein the first end portion 31 of the heat-conducting member 3 extends from the first board 11, and the main body portion 33 of the heat-conducting member 3 extends towards the first board 11 without contacting the dielectric board 21. Accordingly, the second end portion 32 of the heat-conducting member 3 can be disposed in proximity of the functional circuit layer 22 and not affect the normal operation of internal circuits (not shown) in the dielectric board 21.

One of the advantages of the present disclosure is that the heat-dissipating board structure can balance a light-weight and thin design with structural strength and heat-dissipation efficiency so as to meet the design requirements of a light-weight and thin electronic product by the technical solution as follows: the first board is correspondingly engaged with the second board to form an accommodating chamber therebetween, the heat-transmitting layer is disposed in the accommodating chamber and arranged between the first metal protrusions on the inner surface of the first board and the second metal protrusions on the inner surface of the second board, and the buffering liquid is filled in a residual space of the accommodating chamber.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A heat-dissipating board structure, comprising:
a first board having a first inner surface, wherein the first inner surface has a plurality of first metal protrusions thereon, the first board includes a first substrate layer and at least one first metal layer formed on the first substrate layer, and the first metal protrusions are formed on the first metal layer, and wherein the first board has at least one first blind hole that passes through the first substrate layer, and the first blind hole is filled with a heat-conducting material, and/or at least one first through hole that passes through the first substrate layer and the first metal layer, and the first through hole is filled with the heat-conducting material;
a second board correspondingly engaged with the first board to form an accommodating chamber therebetween, wherein the second board has a second inner surface, and the second inner surface has a plurality of second metal protrusions thereon;
a heat-transmitting layer disposed in the accommodating chamber and arranged between the first metal protrusions and the second metal protrusions; and
a buffering liquid filled in a residual space of the accommodating chamber.

2. The heat-dissipating board structure according to claim 1, wherein the first metal protrusions and the second metal protrusions are staggered relative to each other.

3. The heat-dissipating board structure according to claim 1, wherein the heat-transmitting layer is presented in the form of a porous layer or a continuous layer.

4. The heat-dissipating board structure according to claim 1, wherein the second board includes a second substrate layer and at least one second metal layer formed on the second substrate layer, and the second metal protrusions are formed on the second metal layer, and wherein the second board has at least one second blind hole that passes through the second substrate layer, and the second blind hole is filled with the heat-conducting material.

5. The heat-dissipating board structure according to claim 1, wherein the second board includes a second substrate layer and at least one second metal layer formed on the second substrate layer, and the second metal protrusions are formed on the second metal layer, and wherein the second board has at least one second through hole that passes through the second substrate layer and the second metal layer, and the second through hole is filled with the heat-conducting material.

6. The heat-dissipating board structure according to claim 1, wherein the first board has a first inner side portion and at least one first outer side portion arranged at one side of the first inner side portion, the second board has a second inner side portion and at least one second outer side portion arranged at one side of the second inner side portion, and the accommodating chamber is formed between the first inner side portion and the second inner side portion.

7. The heat-dissipating board structure according to claim 6, further comprising at least one heat-conducting column connected between the first outer side portion and the second outer side portion.

8. The heat-dissipating board structure according to claim 1, having a thickness between 0.2 mm and 0.5 mm, wherein the first metal protrusions and the second metal protrusions have an average height between 30 μm and 220 μm.

9. A circuit board module, comprising:
a heat-dissipating board structure, including:
a first board having a first inner surface, wherein the first inner surface has a plurality of first metal protrusions thereon, the first board includes a first substrate layer and at least one first metal layer formed on the first substrate layer, and the first metal protrusions are formed on the first metal layer, and wherein the first board has at least one first blind hole that passes through the first substrate layer, and the first blind hole is filled with a heat-conducting material, and/or at least one first through hole that passes through the first substrate layer and the first metal layer, and the first through hole is filled with the heat-conducting material;
a second board correspondingly engaged with the first board to form an accommodating chamber therebetween, wherein the second inner surface has a plurality of second metal protrusions thereon;
a heat-transmitting layer disposed in the accommodating chamber and arranged between the first metal protrusions and the second metal protrusions; and
a buffering liquid filled in a residual space of the accommodating chamber;
a high-frequency high-speed board disposed on the first board of the heat-dissipating board structure, wherein the high-frequency high-speed board includes a dielectric board and at least one functional circuit layer formed on the dielectric board; and
a heat-conducting member having a first end portion and a second end portion, wherein the first end portion is thermally connected to the first board of the heat-dissipating board structure and the second end portion is disposed in proximity to the functional circuit layer.

10. The circuit board module according to claim 9, wherein the first metal protrusions and the second metal protrusions are staggered relative to each other.

11. The circuit board module according to claim 9, wherein the heat-transmitting layer is presented in the form of a porous layer or continuous layer.

12. The circuit board module according to claim 9, wherein the second board includes a second substrate layer and at least one second metal layer formed on the second substrate layer, and the second metal protrusions are formed on the second metal layer, and wherein the second board has at least one second blind hole that passes through the second substrate layer, and the second blind hole is filled with the heat-conducting material.

13. The circuit board module according to claim 9, wherein the second board includes a second substrate layer and at least one second metal layer formed on the second substrate layer, and the second metal protrusions are formed on the second metal layer, and wherein the second board has at least one second through hole that passes through the second substrate layer and the second metal layer, and the second through hole is filled with the heat-conducting material.

14. The circuit board module according to claim 9, wherein the first board has a first inner side portion and at least one first outer side portion arranged at one side of the first inner side portion, the second board has a second inner side portion and at least one second outer side portion arranged at one side of the second inner side portion, and the accommodating chamber is formed between the first inner side portion and the second inner side portion.

15. The circuit board module according to claim 14, further comprising at least one heat-conducting column connected between the first outer side portion and the second outer side portion.

16. The circuit board module according to claim 9, having a thickness between 0.2 mm and 0.5 mm, wherein the first metal protrusions and the second metal protrusions have an average height between 30 µm and 220 µm.

* * * * *